(12) United States Patent
Iida et al.

(10) Patent No.: US 9,291,497 B2
(45) Date of Patent: Mar. 22, 2016

(54) SENSOR SYSTEM HAVING A PLURALITY OF COUPLED SENSORS

(71) Applicant: OMRON CORPORATION, Kyoto (JP)

(72) Inventors: Yusuke Iida, Kyoto (JP); Koji Iguchi, Kyoto (JP); Hideyuki Kishiba, Kyoto (JP); Kiyohiko Gondo, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 175 days.

(21) Appl. No.: 14/051,505

(22) Filed: Oct. 11, 2013

(65) Prior Publication Data

US 2014/0131555 A1 May 15, 2014

(30) Foreign Application Priority Data

Nov. 9, 2012 (JP) .................................. 2012-247176

(51) Int. Cl.

| G01J 1/42 | (2006.01) |
|---|---|
| G01S 17/02 | (2006.01) |
| G01S 17/87 | (2006.01) |
| G01S 7/00 | (2006.01) |
| G01S 7/497 | (2006.01) |
| G01S 7/481 | (2006.01) |
| H04L 12/40 | (2006.01) |
| H03K 17/94 | (2006.01) |
| G01V 8/20 | (2006.01) |

(52) U.S. Cl.
CPC ............... *G01J 1/4228* (2013.01); *G01S 7/003* (2013.01); *G01S 7/4818* (2013.01); *G01S 7/497* (2013.01); *G01S 17/026* (2013.01); *G01S 17/87* (2013.01); *H03K 17/941* (2013.01); *H03K 17/943* (2013.01); *H04L 12/4015* (2013.01); *H04L 12/40019* (2013.01); *G01V 8/20* (2013.01); *H03K 2217/94094* (2013.01); *H03K 2217/94104* (2013.01); *H03K 2217/94108* (2013.01)

(58) Field of Classification Search
CPC ....... G01S 17/026; G01S 17/87; G01S 7/003; G01S 7/4818; G01S 7/497; G01J 1/4228; G01V 8/20; H03K 17/941; H03K 17/943; H03K 2217/94094; H03K 2217/94104; H03K 2217/94108; H04L 12/40019; H04L 12/4015
See application file for complete search history.

(56) References Cited

U.S. PATENT DOCUMENTS

2012/0022826 A1* 1/2012 Giesekus ...................... 702/150

FOREIGN PATENT DOCUMENTS

JP 3478646 B2 12/2003

* cited by examiner

*Primary Examiner* — Francis M Legasse, Jr.
(74) *Attorney, Agent, or Firm* — Greenblum & Bernstein, P.L.C.

(57) ABSTRACT

In a sensor system including a plurality of photoelectric sensor units, a light projecting period arbitrarily determined in each type is provided and mutual interference is prevented between identical types. The sensor system includes the plurality of sensor units coupled by a connector unit while a signal can be transmitted. Each of the sensor units retains type information thereof, and sets a unique identification number by transmitting the signal to each other. Each sensor unit operates after a delay time determined according to the identification number thereof elapses with a synchronous signal as a starting point. The synchronous signal is transmitted with a predetermined period from the sensor unit having a specific identification number in the plurality of sensor units. The delay time of each sensor unit is determined such that an operating period is matched with a predetermined period determined in each piece of the type information.

10 Claims, 11 Drawing Sheets

FIG. 8

| # | MEANING | CONTENT |
|---|---|---|
| byte:0 | IDENTIFICATION HEADER | 0xff |
| byte:1 | OWN CH NUMBER | 0x01 |
| byte:2 | THE NUMBER OF SENSORS OF TYPE A | 0x01 |
| byte:3 | THE NUMBER OF SENSORS OF TYPE B | 0x00 |
| byte:4 | THE NUMBER OF SENSORS OF TYPE C | 0x00 |
| byte:5 | THE NUMBER OF SENSORS OF TYPE D | 0x00 |
| byte:6 | THE NUMBER OF SENSORS OF TYPE E | 0x00 |
| byte:7 | THE NUMBER OF SENSORS OF TYPE F | 0x00 |
| byte:8 | THE NUMBER OF SENSORS OF TYPE G | 0x00 |
| byte:9 | THE NUMBER OF SENSORS OF TYPE H | 0x00 |

FIG. 9

| # | MEANING | CONTENT |
|---|---|---|
| byte:0 | IDENTIFICATION HEADER | 0xff |
| byte:1 | OWN CH NUMBER | 0x02 |
| byte:2 | THE NUMBER OF SENSORS OF TYPE A | 0x02 |
| byte:3 | THE NUMBER OF SENSORS OF TYPE B | 0x00 |
| byte:4 | THE NUMBER OF SENSORS OF TYPE C | 0x00 |
| byte:5 | THE NUMBER OF SENSORS OF TYPE D | 0x00 |
| byte:6 | THE NUMBER OF SENSORS OF TYPE E | 0x00 |
| byte:7 | THE NUMBER OF SENSORS OF TYPE F | 0x00 |
| byte:8 | THE NUMBER OF SENSORS OF TYPE G | 0x00 |
| byte:9 | THE NUMBER OF SENSORS OF TYPE H | 0x00 |

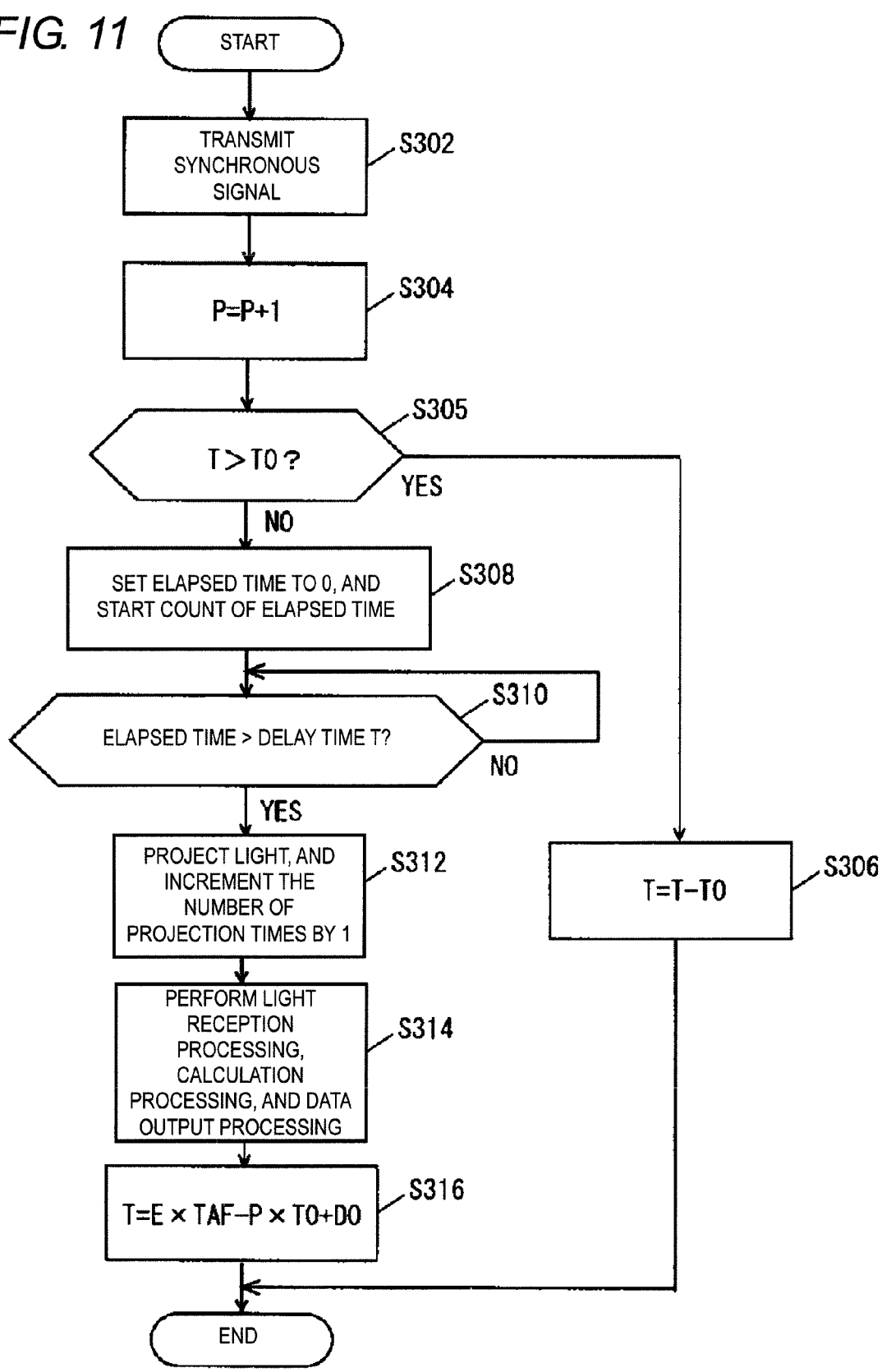

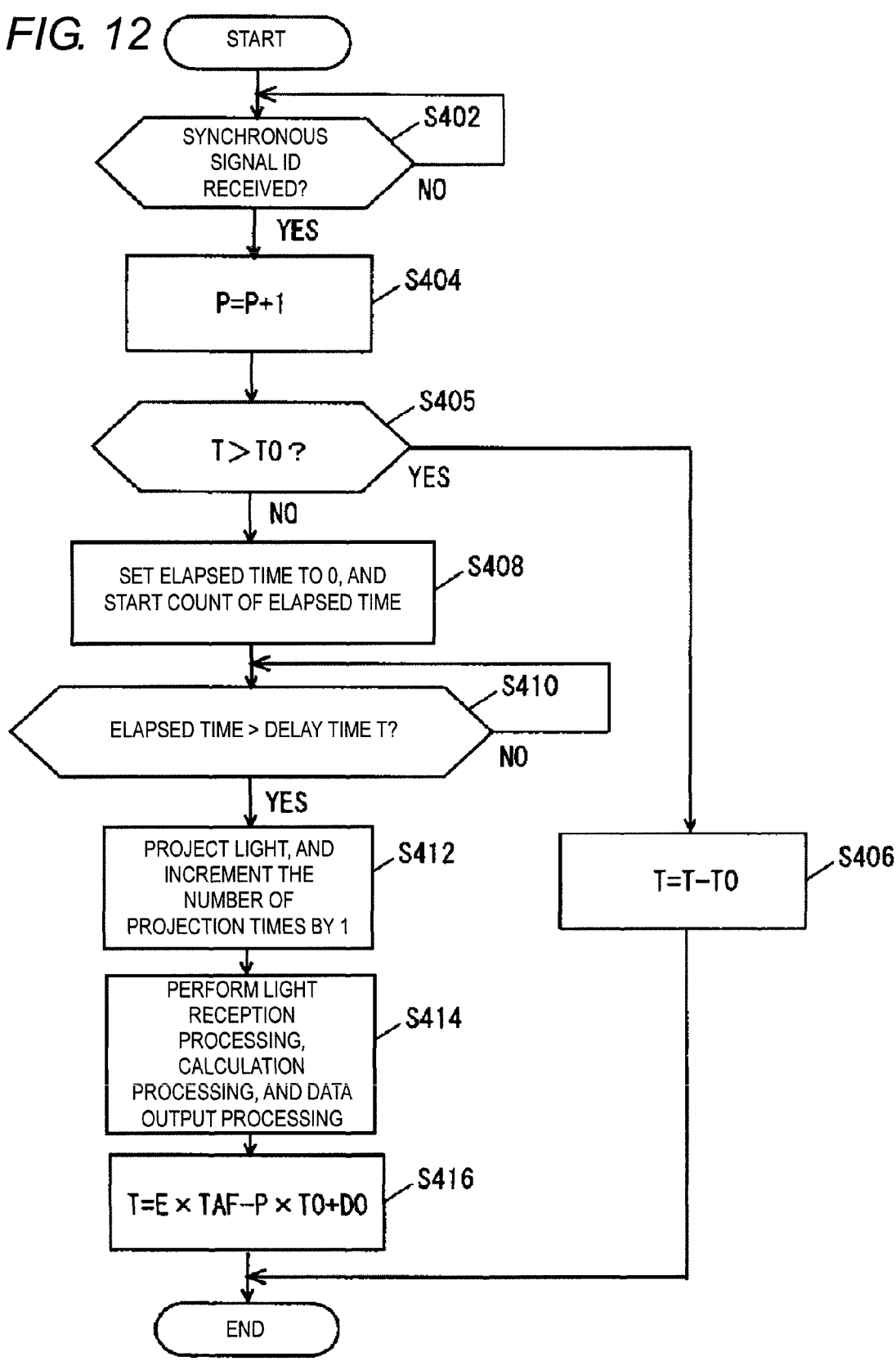

SENSOR SYSTEM HAVING A PLURALITY OF COUPLED SENSORS

CROSS REFERENCE TO RELATED APPLICATIONS

This application claims priority to Japanese Patent Application No. 2012-247176 filed on Nov. 9, 2012, the entire contents of which are incorporated by reference herein.

FIELD

The present invention relates to a sensor system, particularly to a technology for controlling a light projecting time of each sensor unit in a sensor system including a plurality of sensor units.

BACKGROUND

In a production line, whether a workpiece (a detection target object) exists is determined based on a physical amount such as a light reception amount detected by a sensor. The physical amount is detected at a plurality of points. That is, the plurality of sensors are provided. At this point, for example, a light receiving unit of a photoelectric sensor is occasionally disposed near a light receiving unit of another photoelectric sensor. In this case, light projected from a certain photoelectric sensor is incident to a light receiving unit of another photoelectric sensor to degrade determination accuracy. Therefore, there is provided a technique of preventing mutual interference by varying an operation time of the sensor.

Japanese Patent No. 3478646 discloses a technique of varying a light projecting time of the photoelectric sensor. In Japanese Patent No. 3478646, a master unit outputs an external synchronous signal for a predetermined period in a self-excitation manner. When receiving the external synchronous signal, a slave unit generates a light projection pulse signal at a time delayed by a predetermined time compared with the external synchronous signal, and externally outputs the external synchronous signal.

However, in Japanese Patent No. 3478646, because the synchronous signal is output when the slave unit projects the light, the light projecting time of the slave unit located at a lower stage depends on the light projecting time of the slave unit located at an upper stage. For example, when the slave unit located at the upper stage is the photoelectric sensor of a type (a model) having the long light projecting period, because the light projecting period becomes longer than a period during which the synchronous signal is transmitted to the slave unit located at the lower stage, the light projecting period of the slave unit located at lower stage is also lengthened. Accordingly, the light projecting period of the photoelectric sensor located at the lower stage is unnecessarily lengthened in a system in which the photoelectric sensor of the type having the short light projecting period and the photoelectric sensor of the type having the long light projecting period are mixed. Therefore, possibly a response speed is decreased to degrade measurement accuracy.

SUMMARY

The embodiment has been devised to solve the problems described above, and an object thereof is to provide the light projecting period arbitrarily determined in each type and prevent the mutual interference between identical types in a sensor system including a plurality of sensor units.

In accordance with one aspect of the embodiment, a sensor system includes a plurality of sensor units that are coupled by a connector unit in such a manner that a signal can be transmitted. In the sensor system, each of the sensor units retains type information thereof, and sets a unique identification number by transmitting the signal to each other. Each of the sensor units operates after a delay time determined according to the identification number thereof elapses with a synchronous signal as a starting point, the synchronous signal being transmitted with a predetermined period from the sensor unit having a specific identification number in the plurality of sensor units. The delay time of each of the sensor units is determined such that an operating period is matched with a predetermined period determined in each piece of the type information, and such that the delay time differs from the delay time of any other sensor unit having the identical type information. "The types of the sensor units differ from each other" means that, for example, the sensor units differ from each other in an operating (light projection) time or a wavelength, a period, an amplitude, and a frequency of the projected light. The delay time may be determined so as to be added by a predetermined time fixed in each type with respect to each operation. Examples of the "sensor unit" include a photoelectric sensor unit, an ultrasonic sensor unit, and a proximity sensor unit.

Because the identical types differ from each other in the operation time, the mutual interference is prevented between identical types. Because the operation time has no influence between the different types, the operating period can arbitrarily be set in each of the plurality of types. Although the operation times overlap each other between the different types, the light can be distinguished from a characteristic except the light reception time when the types differ from each other. Therefore, there is little influence on the determination accuracy.

The delay time may be shortened when the delay time is longer than a transmission period of the synchronous signal. In this case, the delay time may be shortened by the transmission period. An operating period of each type may be longer than a summation of the delay times of the sensor units having the identical type information.

The sensor units may be disposed adjacent to each other. In this case, the sensor units adjacent to each other may be coupled by the connector unit in such a manner that the signal can be transmitted.

The connector unit may be an optical connector that comprises a pair of a light projecting element and a light receiving element. In this case, a driving circuit of the light receiving element may electrically be connected to a driving circuit of the light projecting element in the sensor unit. A difference between a light reception time in the light receiving element and a light projecting time from the light projecting element can be decreased by electrically connecting the driving circuit of the light receiving element to the driving circuit of the light projecting element in the sensor unit. Therefore, a signal transmission delay can be decreased.

BRIEF DESCRIPTION OF THE DRAWINGS

FIG. 8 is a view illustrating binary data transmitted by a master unit;

FIG. 9 is a view illustrating binary data transmitted by a slave unit;

FIG. 11 is a flowchart illustrating processing, which is performed by the master unit in order to measure a light reception amount; and FIG. 12 is a flowchart illustrating processing, which is performed by the slave unit in order to measure the light reception amount.

DETAILED DESCRIPTION

Figure 1:
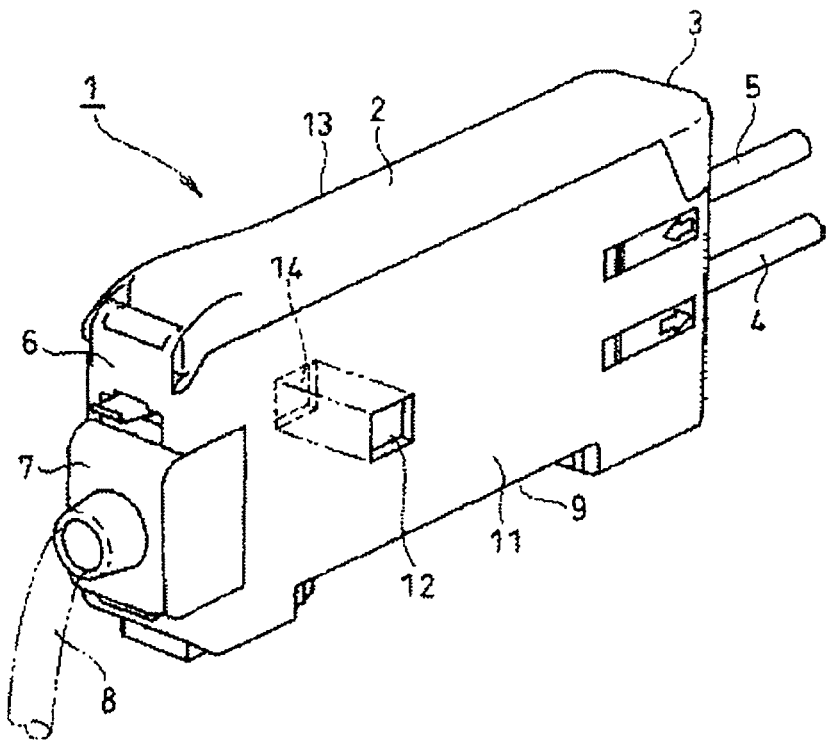
FIG. 1 is a perspective view illustrating a photoelectric sensor unit.

Hereinafter, an embodiment of the present invention will be described with reference to the drawings. In the drawings, the identical component is designated by the identical numeral, and a name and a function thereof are also identical. Accordingly, the detailed overlapping description is not neglected.

Figure 2:
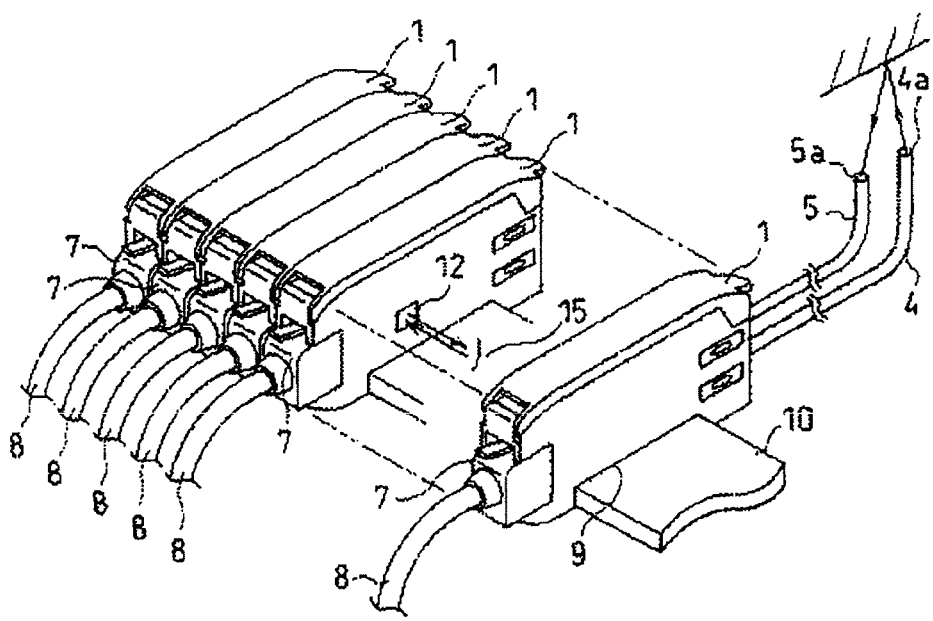
FIG. 2 is a perspective view illustrating a state in which the photoelectric sensor units are arrayed.

Referring to FIG. 2, a sensor system of the embodiment includes a plurality of types of photoelectric sensor units 1. For example, the types are distinguished from each other by an operating (light projecting) time and a wavelength, a period, an amplitude, and a frequency of the projected light. That is, the types differ from each other in the light projecting time and the wavelength, the period, the amplitude, and the frequency of the projected light. For example, an ultrasonic sensor unit and a proximity sensor unit may be included in the sensor system instead of or in addition to the photoelectric sensor unit 1.

Referring to FIG. 1, by way of example, each photoelectric sensor unit 1 is a fiber type photoelectric sensor unit 1. The photoelectric sensor unit 1 includes a housing 2 having a flat, substantially rectangular solid shape. An out-bound optical fiber cable 4 and an in-bound optical fiber cable 5 are drawn out from a rear end portion 3 of the housing 2. Leading ends of the optical fiber cables 4 and 5 are connected to sensor heads 4a and 5a disposed in a detection area.

An electric cable (electric cord) 8 is drawn out from a front end portion 6 of the housing 2 with a connector 7 interposed therebetween. The electric cable 8 is used to lead an output signal (for example, on and off signals or a light quantity value signal) of a sensing system circuit (not illustrate) in the housing 2. For example, the electric cable 8 is connected to a control device (not illustrate) such as a Programmable Logic Controller (PLC). A DIN rail mounting groove 9 used to mount the housing 2 is formed in a bottom surface of the housing 2.

An optical communication window 12 for right-hand communication is disposed in a right side surface 11 of the housing 2, and an optical communication window 14 for left-hand communication is disposed in a left side surface 13 of the housing 2. The optical communication windows 12 and 14 are illustrated as a through-hole in FIG. 1. However, actually the optical communication windows 12 and 14 are closed by resin filters, and formed into flat surfaces flush with the side surfaces of the housing 2. The resin filter transmits an infrared ray and cuts off a visible ray.

A pair of a light emitting element and a light receiving element (not illustrate) for right-hand communication is disposed behind the optical communication window 12 of the right side surface, and the infrared ray is used in the pair of the light emitting element and the light receiving element for right-hand communication. A pair of a light emitting element and a light receiving element (not illustrate) for left-hand communication is disposed behind the optical communication window 14 of the left side surface, and the infrared ray is used in the pair of the light emitting element and the light receiving element for left-hand communication.

FIG. 2 illustrates the state in which many photoelectric sensor units 1 are mounted on a DIN rail. As illustrated in FIG. 2, when the many photoelectric sensor units 1 are closely mounted on a DIN rail 10 using the DIN rail mounting groove 9 provided in the bottom surface of each photoelectric sensor unit 1, the photoelectric sensor units 1 are closely adjacent to each other and arranged in line. At this point, the optical communication window 12 and the optical communication window 14 are opposed to each other. Therefore, as indicated by an arrow 15 in FIG. 2, bidirectional optical communication in which the infrared ray is used can be conducted between the photoelectric sensor units 1 and 1 adjacent to each other through the optical communication windows 12 and 14.

Figure 3:
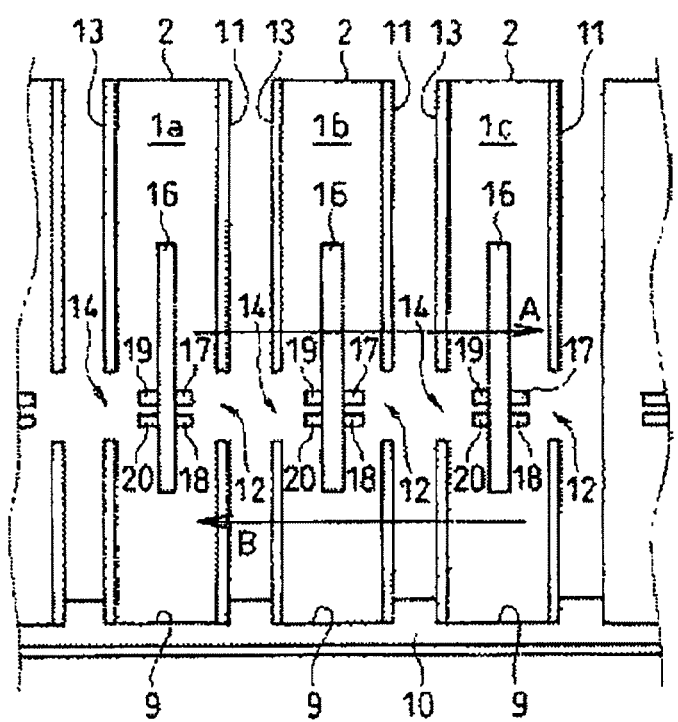
FIG. 3 is a sectional view illustrating a positional relationship between a disposition of light projecting/light receiving element and an optical communication window in the photoelectric sensor unit.

FIG. 3 is a sectional view of the housing 2, and illustrates an example of a support structure of the light emitting element and the light receiving element in the housing 2 of the photoelectric sensor unit 1. FIG. 3 illustrates the state in which three photoelectric sensor units 1a, 1b, and 1c are disposed while being closely adjacent to each other.

As illustrated in FIG. 3, a circuit board 16 on which various circuit components are mounted is accommodated in the housing 2 of each of the photoelectric sensor unit 1a, 1b, and 1c. The circuit board 16 is supported by a support mechanism (not illustrated) in an attitude parallel to the right and left side surfaces 11 and 13 of the housing 2.

A right-hand communication light emitting element (for example, an infrared-emitting diode) 17 and a light receiving element (for example, photodiode) 18 are attached to a right side surface of the circuit board 16 in FIG. 3. The elements 17 and 18 are positioned so as to be opposed to the optical communication window 12 provided in the right side surface 11 of the housing 2. Similarly, a left-hand communication light receiving element (for example, a photodiode) 19 and a light emitting element (for example, an infrared-emitting diode) 20 are attached to a left side surface of the circuit board 16 in FIG. 3. The elements 19 and 20 are positioned so as to be opposed to the optical communication window 14 provided in the left side surface 13 of the housing 2. Although not illustrated in FIG. 3, the right and left optical communication windows 12 and 14 are closed by a visible ray cutoff filter.

According to the above configuration, a signal can be transmitted toward a direction indicated by an arrow A in FIG. 3 by repeatedly performing processing, in which the light emitted from the light emitting element 17 is received by the light receiving element 19, between the sensor units adjacent to each other. A signal can be transmitted toward a direction indicated by an arrow B in FIG. 3 by repeatedly performing processing, in which the light emitted from the light emitting element 20 is received by the light receiving element 18, between the sensor units adjacent to each other. That is, in the example in FIG. 3, data can bi-directionally be transmitted among the photoelectric sensor units 1a, 1b, and 1c.

A lens that improves light transmission/reception efficiency between the light emitting element and the light receiving element, which are opposed to each other between the sensor units adjacent to each other, may be disposed in the right and left optical communication windows 12 and 14 of the housing 2. For example, any optical lens and a Fresnel lens can be used as the lens.

Figure 4:
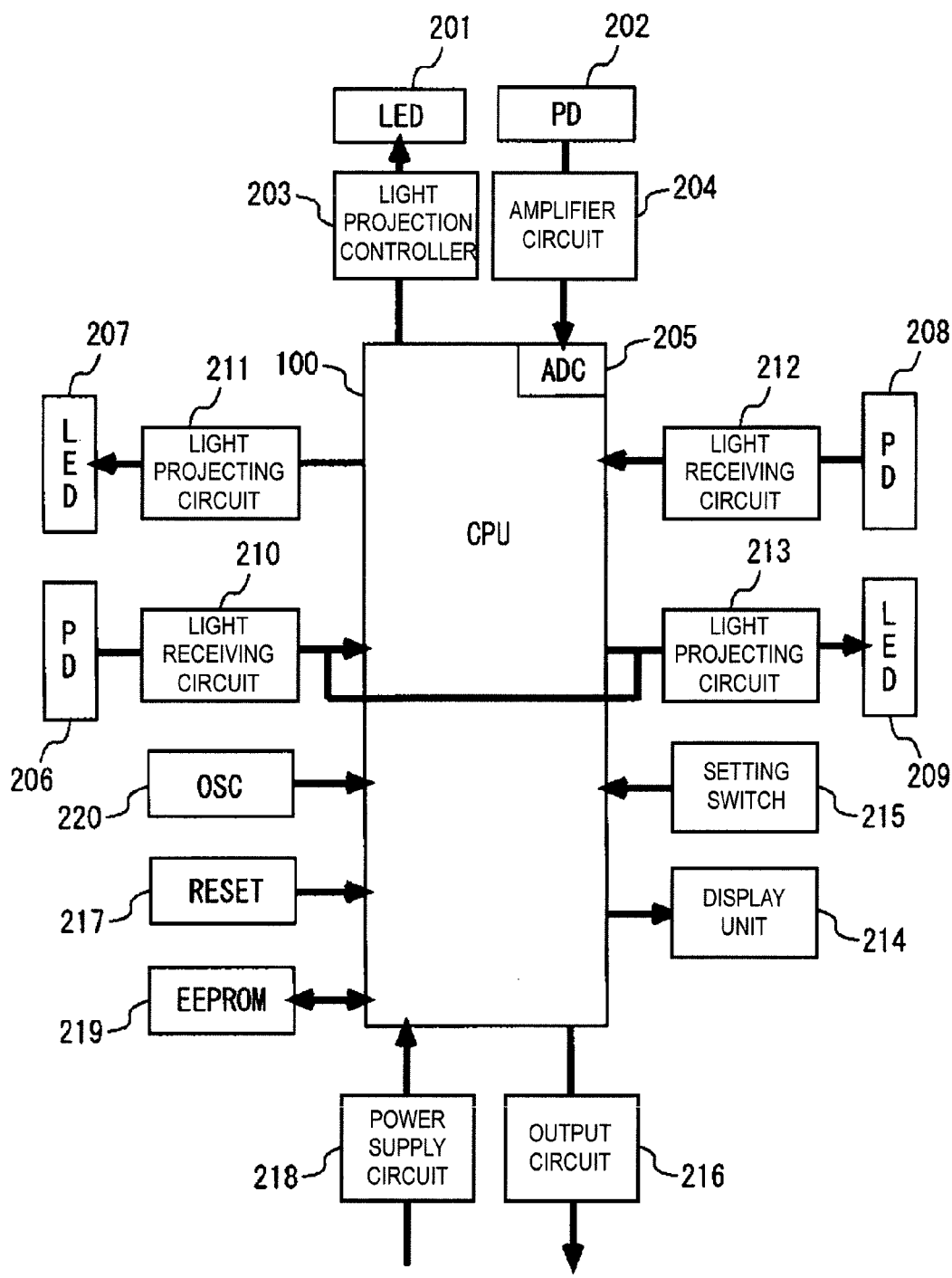
FIG. 4 is a view illustrating an internal configuration of the photoelectric sensor unit.

An internal structure of the photoelectric sensor unit 1 will be described with reference to FIG. 4. The photoelectric sensor unit 1 is constructed by various processing functions implemented in a software manner by a CPU (Central Processing Unit) 100 and various processing functions implemented in a hardware manner by a dedicated circuit.

The CPU 100 controls a light projection controller 203 to cause a light emitting element (LED) 201 to emit the infrared ray. More specifically, the CPU 100 controls the light projection controller 203 such that the light emitting element 201 operates (more specifically, projects the light) after a delay time T determined in each photoelectric sensor unit 1 elapses with a synchronous signal as a starting point. The synchronous signal is transmitted from the photoelectric sensor unit 1 recognized as a master unit in the plurality of photoelectric sensor units 1. The delay time T of each photoelectric sensor unit 1 is determined so as to differ from a delay time T of another photoelectric sensor unit 1, in which a light projecting period is matched with a predetermined period TF determined in each piece of type information and which has the identical type information. The type information expresses a type of the photoelectric sensor unit 1. Each photoelectric sensor unit 1 retains the type information.

A signal that is generated by the light reception of a light receiving element (PD) 202 is amplified by an amplifier circuit 204, converted into a digital signal by an A/D converter 205, and taken in the CPU 100. The CPU 100 directly binarizes the light reception data, or binarizes the light reception data by a comparison to a previously-set threshold. Then the CPU 100 transmits the binarized data to the outside.

The CPU 100 controls left light projecting circuit 211 and right light projecting circuit 213 to cause left communication light emitting element (LED) 207 and right communication light emitting element (LED) 209 to emit the infrared rays to the adjacent photoelectric sensor units. The infrared rays coming from the adjacent right and left photoelectric sensor units are received by left light receiving element (PD) 206 and right light receiving element (PD) 208, and the light reception signals are transmitted to the CPU 100 through light receiving circuits 210 and 212. The CPU 100 conducts optical communication with the right and left adjacent sensors by controlling the transmitted and received signals based on a predetermined protocol.

The light receiving element 206, the communication light emitting element 209, the light receiving circuit 210, and the light projecting circuit 213 are used to transmit and receive the synchronous signal that prevents mutual interference between the photoelectric sensor units 1. Specifically, in each photoelectric sensor unit 1, the light receiving circuit 210 and the light projecting circuit 213 are directly connected to each other. This configuration quickly transmits the received synchronous signal from the communication light emitting element 209 to adjacent another photoelectric sensor unit 1 through the light projecting circuit 213 while the CPU 100 does not perform delay processing.

As described above, the one photoelectric sensor unit 1 recognized as the master unit from the plurality of photoelectric sensor units 1 transmits the synchronous signal with a predetermined period. For example, the photoelectric sensor unit 1, in which the light receiving element 206 does not receive the infrared ray in a period during which all the photoelectric sensor units 1 are controlled such that the communication light emitting element 209 emits the infrared ray, recognizes itself as the master unit. That is, in the photoelectric sensor units 1 arranged in line, one of the photoelectric sensor units 1 located at both ends is the master unit.

The CPU 100 controls lighting of a display unit 214. The CPU 100 processes a signal from a setting switch 215. A signal generated by the CPU 100 is transmitted to the PLC through an output circuit 216. A signal obtained from a reset unit 217 is transmitted to the CPU 100 to reset measurement control. A power supply circuit 218 supplies a power necessary to drive the CPU 100. Various kinds of data necessary for the operation of the CPU 100 are stored in a recording medium such as an EEPROM (Electrically Erasable Programmable Read Only Memory) 219. A reference clock is input from an oscillator (OSC) 220 to the CPU 100.

A mutual interference preventing operation in the sensor system in which the plurality of photoelectric sensor units 1 are used will be described below with reference to FIGS. 5 and 6.

Figure 5:
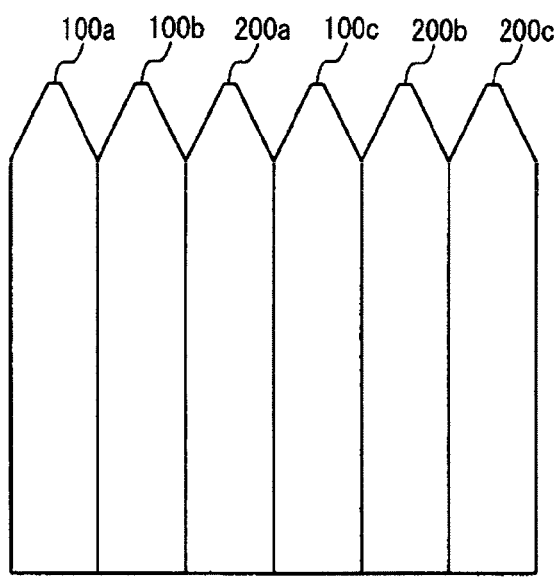
FIG. 5 is a view illustrating a sensor system in which three photoelectric sensor units of a type A and three photoelectric sensor units of a type B are arrayed.
Figure 6:
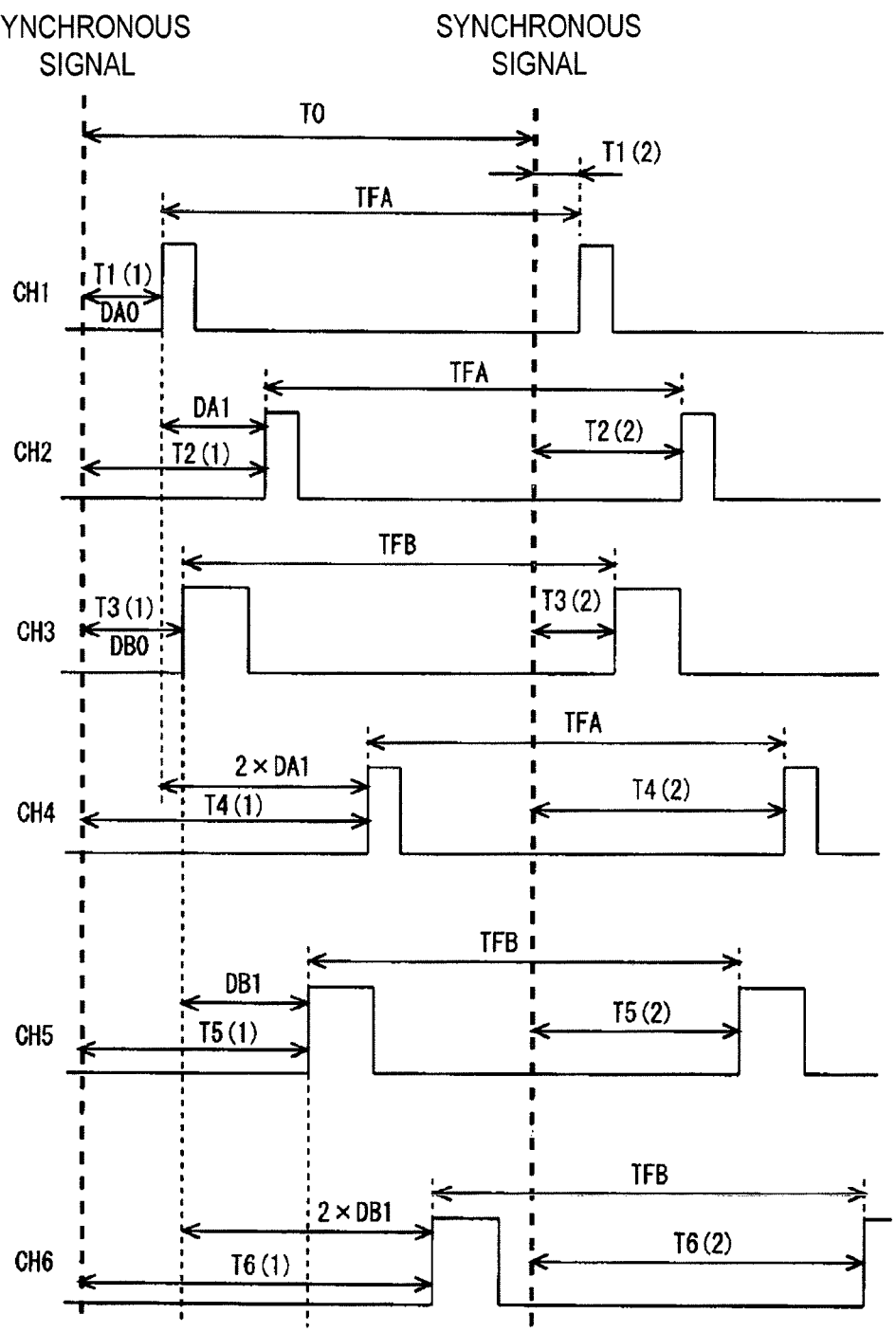
FIG. 6 is a view illustrating a delay time of each photoelectric sensor unit.

FIGS. 5 and 6 illustrate an example in which three photoelectric sensor units 100a, 100b, and 100c of a type A and three photoelectric sensor units 200a, 200b, and 200c of a type B are used. The number of types of the photoelectric sensor unit and the number of photoelectric sensor units of each type are not limited to those in FIGS. 5 and 6.

In FIGS. 5 and 6, it is assumed that the photoelectric sensor unit 100a is the master unit. It is also assumed that the photoelectric sensor unit 100b, the photoelectric sensor unit 200a, the photoelectric sensor unit 100c, the photoelectric sensor unit 200b, and the photoelectric sensor unit 200c, which are of the slave unit, are disposed in the order close to the master unit.

In the example in FIGS. 5 and 6, a channel (CH) number of the photoelectric sensor unit 100a is recognized as "1". Similarly, the channel number of photoelectric sensor unit 100b is recognized as "2". The channel number of the photoelectric sensor unit 200a is recognized as "3". The channel number of the photoelectric sensor unit 100c is recognized as "4". The channel number of the photoelectric sensor unit 200b is recognized as "5". The channel number of the photoelectric sensor unit 200c is recognized as "6".

As described above, in the embodiment, the photoelectric sensor unit 100a recognized as the master unit transmits the synchronous signal with a predetermined period T0. Each photoelectric sensor unit projects the light after the delay time T determined in each photoelectric sensor unit elapses with the transmitted synchronous signal as the starting point. The delay time T of each photoelectric sensor unit is determined so as to differ from the delay time T of another photoelectric sensor unit (another photoelectric sensor unit having the identical type information) of the identical type.

Specifically, a delay time T1(1) of the master unit (the photoelectric sensor unit 100a) is DA0 (DA0≥0) with respect to the synchronous signal transmitted for a first time. The delay time DA0 is previously determined by the developer.

A delay time T2(1) of the photoelectric sensor unit 100b is DA0+DA1 (DA1>0) with respect to the synchronous signal transmitted for the first time. The time DA1 is previously determined by the developer based on a detection principle of the sensor and a light projecting period TFA determined from specifications of the type A. For example, the time DA1 is determined such that the light projecting period TFA of the type A is longer than a summation of the delay times of the photoelectric sensor units of the type A.

A delay time T4(1) of the photoelectric sensor unit 100c is DA0+2×DA1 with respect to the synchronous signal transmitted for the first time.

A delay time T3(1) of the photoelectric sensor unit 200a is DB0 (DB0≥0) with respect to the synchronous signal transmitted for the first time. The delay time DB0 is previously determined by the developer.

A delay time T5(1) of the photoelectric sensor unit 200b is DB0+DB1 (DB1>0) with respect to the synchronous signal transmitted for the first time. The time DB1 is previously determined by the developer based on the detection principle of the sensor and a light projecting period TFB of the type B. For example, the time DA1 is determined such that the light projecting period TFB determined from specifications of the type B is longer than a summation of the delay times of the photoelectric sensor units of the type B.

A delay time T6(1) of the photoelectric sensor unit 200c is DA0+2×DB1 with respect to the synchronous signal transmitted for the first time.

As is clear from the above description, in the embodiment, the delay time is determined so as to be added by a predetermined time fixed in the light projection order on each type. That is, the delay time of the photoelectric sensor unit of the type A is determined so as to be added by the time DA1. The delay time of the photoelectric sensor unit of the type B is determined so as to be added by the time DB1.

Each of delay times T1(2), T2(2), T3(2), T4(2), T5(2), and T6(2) of the photoelectric sensor units with respect to the synchronous signal transmitted for a second time is determined such that the light projecting period of each photoelectric sensor unit is matched with a predetermined period determined in each piece of type information, and such that the light projecting period differs from the delay time of another photoelectric sensor unit having the identical type information.

That is, the delay times T1(2), T2(2), and T4(2) of the photoelectric sensor units of the type A is determined such that the actual light projecting period of each photoelectric sensor unit is matched with the predetermined light projecting period TFA determined in each type, and such that the actual light projecting period differs from the delay time of another photoelectric sensor of the identical type.

Similarly, the delay times T3(2), T5(2), and T6(2) of the photoelectric sensor units of the type B is determined such that the actual light projecting period of each photoelectric sensor unit is matched with the predetermined light projecting period TFB determined in each type, and such that the actual light projecting period differs from the delay time of another photoelectric sensor of the identical type.

The delay time of each photoelectric sensor unit with respect to the synchronous signal transmitted for a third time or subsequent times is determined such that the actual light projecting period of each photoelectric sensor unit is matched with the predetermined period TF determined in each type, and such that the actual light projecting period differs from the delay time of another photoelectric sensor of the identical type information.

Processing in which each photoelectric sensor unit 1 recognizes the channel number will be described below with reference to FIG. 7.

In Step (hereinafter, Step is abbreviated to S) 100, each photoelectric sensor unit 1 sets both an infrared input port and an infrared output port to a general-purpose input/output allocation, and turns on an infrared output for a predetermined time interval. That is, the communication light emitting element 209 emits the infrared ray for the predetermined time interval.

After the predetermined time interval elapses since the infrared ray is emitted, when the infrared ray is not received from the light receiving element 206 (NO in S102), the channel number is recognized as "1" in S104. That is, the photoelectric sensor unit 1 is recognizes itself as the master unit.

After a predetermined time elapses, in S106, each photoelectric sensor unit 1 switches both the infrared input port and the infrared output port to a UART (Universal Asynchronous Receiver Transmitter) allocation, and the photoelectric sensor unit 1 that is of the master unit transmits the binary data shown in FIG. 8 to the adjacent photoelectric sensor unit 1 (for example, a neighbor on the right) using the infrared output. The binary data is repeatedly output at least predetermined times in consideration of different power-on timing. That the channel number of the master unit is a channel 1 is expressed by inputting data "0x01" as an "own CH number". That the one photoelectric sensor unit 1 of the type A is recognized is expressed by inputting data "0x01" as "the number of sensors of type A". That is, the master unit that transmits the binary data in FIG. 8 has the type "A". For example, in the case that the master unit has the type "B", data "0x00" is input as "the number of sensors of type A" while data "0x01" is input as "the number of sensors of type B". The type information indicating the type of the photoelectric sensor unit 1 is retained by each photoelectric sensor unit 1.

The number of sensors in each type also expresses order m of the sensor in each type. For example, that the order m is "1" in a group of the photoelectric sensor units 1 of the type A is expressed by inputting data "0x01" as "the number of sensors of type A".

As used herein, "the infrared input port and the infrared output port are set to general-purpose input/output allocation" means that "the infrared input port and the infrared output port are not set to the UART allocation".

Figure 7:
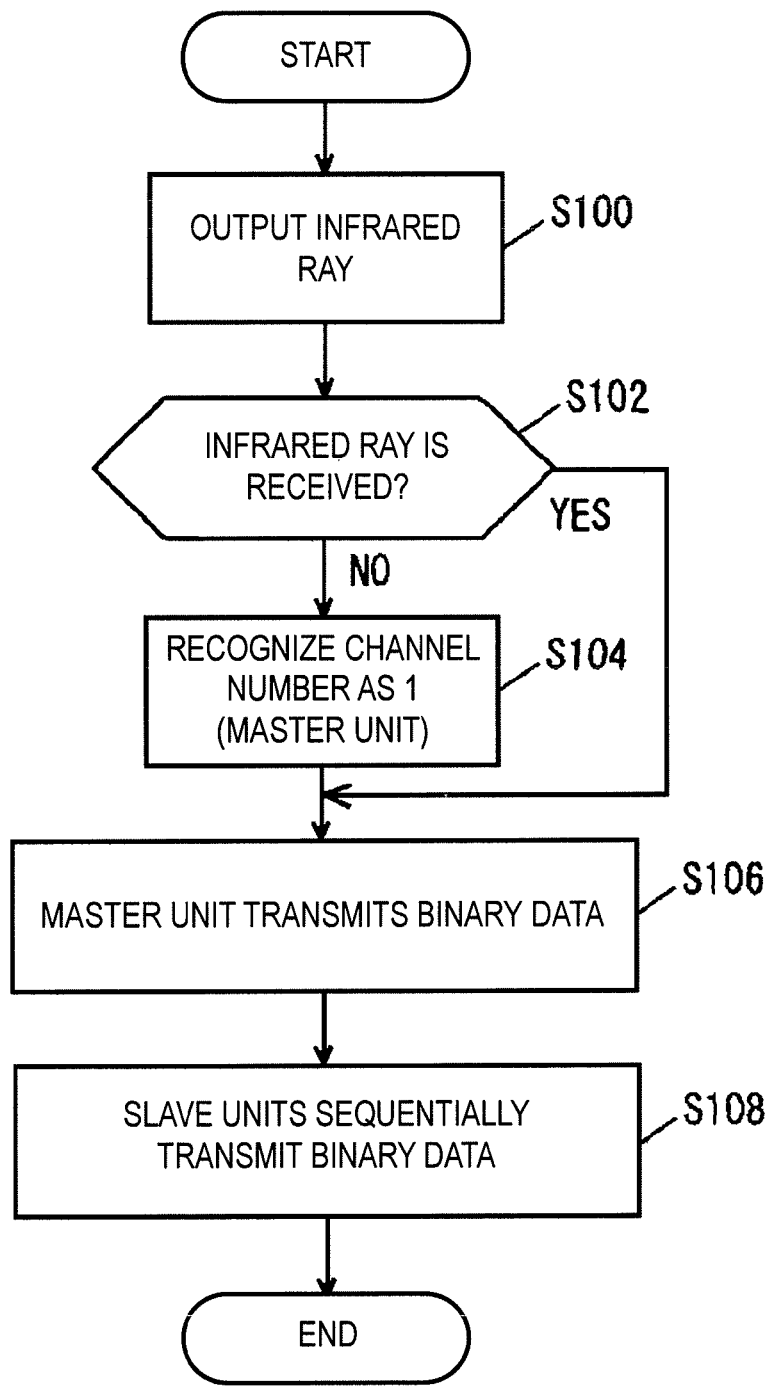
FIG. 7 is a flowchart illustrating processing, which is performed by each photoelectric sensor unit in order to recognize a channel number.

Referring to FIG. 7, in S108, the photoelectric sensor unit 1 that receives the binary data, namely, the photoelectric sensor unit 1 that is of the slave unit transmits the binary data in FIG. 9 to the adjacent photoelectric sensor unit 1 (for example, the neighbor on the right) using the infrared output. Because data "0x01" is input to the "own CH number" of the received binary data, the photoelectric sensor unit 1 that receives the binary data recognizes itself as a channel 2. That is, the number that is larger than the channel number expressed by the "own CH number" of the received binary data by 1 is recognized as the channel number. In the binary data in FIG. 9, data "0x02" is input as the "own CH number" in order to increment the channel number by 1 to express that the channel number is the channel 2. Therefore, in the case that data "0x05" is input to the "own CH number" of the received binary data, data "0x06" is input to the "own CH number" of the transmitted binary data.

In the example in FIG. 9, because the photoelectric sensor unit 1 that receives the binary data from the master unit is the type "A", "the number of sensors of type A" is incremented by 1 to input data "0x02". That is, it is recognized that the order is "2" in the group of the photoelectric sensor units 1 of the type A.

Thus, the binary data is sequentially transmitted by each photoelectric sensor unit 1. Each photoelectric sensor unit 1 recognizes the number, which is larger than the channel number expressed by the "own CH number" of the received binary data by 1, as the channel number.

Figure 10:
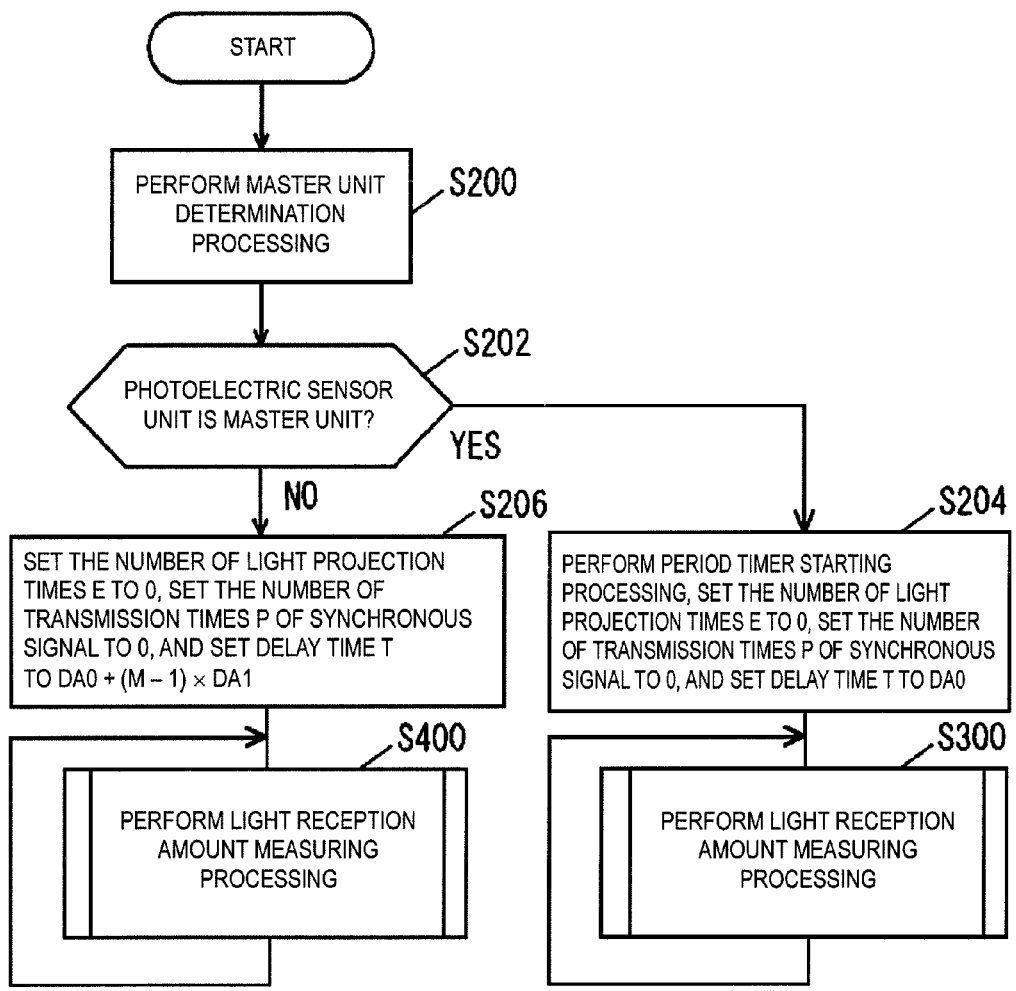
FIG. 10 is a flowchart illustrating processing, which is performed by the photoelectric sensor unit in order to set a delay time.

Processing performed by each photoelectric sensor unit 1 in order to set the delay time T will be described below with reference to FIG. 10. FIG. 10 illustrates the processing that is performed by the photoelectric sensor unit 1 of the type "A" in order to set the delay time T by way of example. The processing that is performed by the photoelectric sensor unit 1 of the type "B" in order to set the delay time T differs from the processing that is performed by the photoelectric sensor unit 1 of the type "A" in order to set the delay time T only in that the "time DB0" and the "time DB1" are used instead of the "time DA0" and the "time DA1". The same holds true for the case that the type different from the type A and the time B is used.

When each photoelectric sensor unit 1 is started, the photoelectric sensor unit 1 determines whether the photoelectric sensor unit 1 itself is the master unit or the slave unit in S200. When the photoelectric sensor unit 1 is the master unit (YES in S202), in S204, processing of starting a period timer is performed, the number of light projection times E is set (reset) to "0" in order to detect a workpiece, the number of transmission times P of the synchronous signal is set (reset) to "0", and the delay time T is set to the time DA0. The delay time T set in S204 is an initial value of the delay time T of the master unit. Then processing of measuring the light reception amount is performed in order to detect the workpiece in S300.

When the photoelectric sensor unit 1 is the slave unit (NO in S202), in S206, the number of light projection times E is set (reset) to "0" in order to detect the workpiece, the number of reception times of the synchronous signal, namely the number of transmission times P of the synchronous signal is set (reset) to "0", and the delay time T is set to time DA0+(m−1)×DA1. "m" is the order in each type, which is expressed by "the number of sensors of type A" of the binary data. The delay time T set in S206 is the initial value of the delay time T of the slave unit. Then processing of measuring the light reception amount is performed in order to detect the workpiece in S400.

Processing performed by the master unit in order to measure the light reception amount will be described with reference to FIG. 11. FIG. 11 illustrates an example when the master unit is the photoelectric sensor unit 1 of the type "A". The case that the master unit is the photoelectric sensor unit 1 of the type "B" differs from the case that the master unit is the photoelectric sensor unit 1 of the type "A" only in that the "time DB0" is used instead of the "time DA0" and that the "light projecting period TFB" is used instead of the "light projecting period TFA". The same holds true for the case that the type different from the type A and the time B is used.

When the master unit transmits the synchronous signal in S302, the number of transmission times P of the synchronous signal is incremented by 1 in S304.

When the present delay time T is longer than the period T0 of the synchronous signal (YES in S305), the delay time T is reset so as to be shorter than the period T0 in S306. Specifically, the delay time T is shortened by the transmission period T0 of the synchronous signal.

When the present delay time T is less than or equal to the period T0 of the synchronous signal (NO in S305), in S308, the elapsed time since the synchronous signal is transmitted is set (reset) to "0", and the count of the elapsed time is started. When the elapsed time exceeds the delay time T (YES in S310), in S312, the light is projected from the sensor head 4a, and the number of light projection times E is incremented by "1".

Then, in S314, the light reception processing, the calculation of the light reception amount, and the comparison of the light reception amount and the threshold are performed, and processing of outputting the data is performed.

When the output of the data is completed, the delay times T from the initial value are set in S316. The delay time T is determined such that the light projecting period is matched with the predetermined period TFA determined in each type, and such that the light projecting period differs from the delay time T of another photoelectric sensor unit of the identical type. More specifically, the delay time T is calculated based on the following equation.

$$\text{delay time } T = E \times TFA \times P \times T0 + DA0 \quad (1)$$

Processing performed by the slave unit in order to measure the light reception amount will be described with reference to FIG. 12. FIG. 12 illustrates an example when the slave unit is the photoelectric sensor unit 1 of the type "A". The case that the slave unit is the photoelectric sensor unit 1 of the type "B" differs from the case that the slave unit is the photoelectric sensor unit 1 of the type "A" only in that the "time DB0" and the "time DB1" are used instead of the "time DA0" and the "time DA1" and that the "light projecting period TFB" is used instead of the "light projecting period TFA". The same holds true for the case that the type different from the type A and the time B is used.

When the slave unit receives the synchronous signal (YES in S402), the number of transmission times P of the synchronous signal is incremented by "1" in S404.

When the present delay time T is longer than the period T0 of the synchronous signal (YES in S405), the delay time T is reset so as to be shorter than the period T0 in S406. Specifically, the delay time T is shortened by the transmission period T0 of the synchronous signal.

When the present delay time T is less than or equal to the period T0 of the synchronous signal (NO in S405), in S408, the elapsed time since the synchronous signal is transmitted is set (reset) to "0", and the count of the elapsed time is started. When the elapsed time exceeds the delay time T (YES in S410), in S412, the light is projected from the sensor head 4a, and the number of light projection times E is incremented by "1".

Then, in S414, the light reception processing, the calculation of the light reception amount, and the comparison of the light reception amount and the threshold are performed, and the processing of outputting the data is performed.

When the output of the data is completed, the delay times T from the initial value are set in S416. The delay time T is determined such that the light projecting period is matched with the predetermined period TFA determined in each type, and such that the light projecting period differs from the delay time T of another photoelectric sensor unit of the identical type. More specifically, the delay time T is calculated based on the following equation.

$$\text{delay time } T = E \times TFA - P \times T0 + DA0 + (m-1) \times DA1 \quad (2)$$

The disclosed embodiment is described only by way of example, but not restrictive in all points. The scope of the present invention is indicated by not the above description but the claims, and the meanings equivalent to the claims and all the changes within the claims are also included in the present invention.

What is claimed is:

1. A sensor system comprising:
a plurality of sensors coupled by a connector such that a signal is transmitted,
wherein each sensor of the plurality of sensors includes information identifying itself as one of a first type or second type, and sets a unique identification number by transmitting the signal to each other,
wherein each sensor of the plurality of sensors operates after a delay time determined according to the identification number thereof elapses with a synchronous signal as a starting point, the synchronous signal being transmitted with a predetermined period from the sensor having a specific identification number in the plurality of sensors, and wherein the delay time of each of the sensors is determined such that each sensor of the same type has the same operating period, and such that the delay time among sensors of the same type is different.

2. The sensor system according to claim 1, wherein the delay time is determined so as to be added by a predetermined time fixed in each type with respect to each operation.

3. The sensor system according to claim 1, wherein the delay time is shortened when the delay time is longer than a transmission period of the synchronous signal, and the sensor system is not operated in the transmission period, and the shortened delay time is determined as a delay time of the next transmission period.

4. The sensor system according to claim 3, wherein the delay time is shortened by the transmission period when the delay time is longer than the transmission period.

5. The sensor system according to claim 1, wherein an operating period of each type is longer than a summation of the delay times of the same type of sensors.

6. The sensor system according to claim 1, wherein the sensors are disposed adjacent to each other, and the sensors adjacent to each other are coupled by the connector unit in such a manner the signal is transmitted.

7. The sensor system according to claim 1, wherein the connector is an optical connector that comprises a pair of a light projecting element and a light receiving element, and a driving circuit of the light receiving element is electrically connected to a driving circuit of the light projecting element in the sensors.

8. The sensor system according to claim 1, wherein each sensor of the plurality of sensors is linearly aligned with each other.

9. The sensor system according to claim 1, wherein:
the first type or second type of sensors include one of different light projecting time, different wavelength, different period, different amplitude, and different frequency of light projected by the sensor.

10. The sensor system according to claim 1, wherein the sensors of the plurality of sensors are optical fiber sensors.

* * * * *